(12) United States Patent
Botker et al.

(10) Patent No.: US 7,161,413 B2
(45) Date of Patent: Jan. 9, 2007

(54) PRECISION CHOPPER-STABILIZED CURRENT MIRROR

(75) Inventors: Thomas L. Botker, Tucson, AZ (US); Benjamin A. Douts, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 97 days.

(21) Appl. No.: 11/154,136

(22) Filed: Jun. 15, 2005

(65) Prior Publication Data

US 2005/0275452 A1 Dec. 15, 2005

Related U.S. Application Data

(60) Provisional application No. 60/580,295, filed on Jun. 15, 2004.

(51) Int. Cl.
*G05F 1/10* (2006.01)
*G05F 3/02* (2006.01)
(52) U.S. Cl. .................................................. 327/543
(58) Field of Classification Search ................ 327/538, 327/540, 541, 543; 323/315
See application file for complete search history.

(56) References Cited

U.S. PATENT DOCUMENTS 5,847,556 A * 12/1998 Kothandaraman et al. .. 323/315
6,166,670 A * 12/2000 O'Shaughnessy ........... 341/136
6,653,894 B1   11/2003 Botker .......................... 330/9

OTHER PUBLICATIONS

Burr-Brown Products, "Precision, Rail-to-Rail I/O Instrumentation Amplifier", Nov. 2004, pp. 1-21.

* cited by examiner

*Primary Examiner*—Quan Tra
(74) *Attorney, Agent, or Firm*—Koppel, Patrick & Heybl (57) ABSTRACT

A chopper-stabilized current mirror includes a pair of FETs connected to mirror an input current $I_{in}$. In one embodiment, switching networks S1 and S2 have their respective inputs connected to the FETs' drains, and are operated with clock signals CLK1 and CLK2, respectively. An $r_o$ boost amplifier A1 has its inputs connected to the outputs of S2 and its outputs connected to the gates of a pair of cascode FETs via a switching network S3 which is operated with clock signal CLK2S, with the drain of one cascode FET connected to $I_{in}$ and the drain of the other providing the mirror's output $I_{out}$. S1 is clocked to reduce mismatch errors and S2 and S3 are clocked to reduce errors due to A1's offset voltage, with CLK2 and CLK2S shifted with respect to CLK1 to reduce errors due to parasitic capacitances.

25 Claims, 6 Drawing Sheets

Phase 1

FIG.1a
(Prior Art)

Phase 2

PRECISION CHOPPER-STABILIZED CURRENT MIRROR

This application claims the benefit of provisional patent application number 60/580,295 to Botker et al., filed Jun. 15, 2004.

BACKGROUND OF THE INVENTION

1. Field of the Invention

This invention relates to the field of current mirrors, and particularly to precision chopper-stabilized current mirrors.

2. Description of the Related Art

Current mirrors are widely used in analog circuit design. Some applications require a mirror that is highly accurate; i.e., with an output current ($I_{out}$) to input current ($I_{in}$) ratio that is precisely known.

Figure 1A:
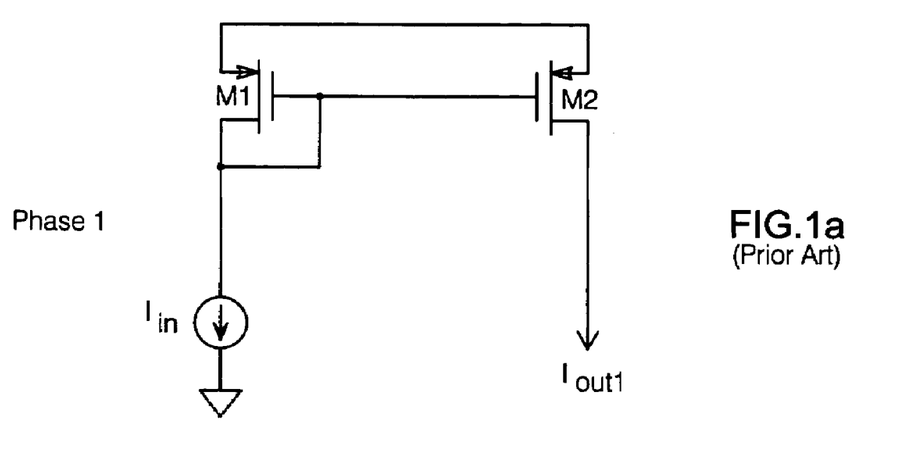
FIGS. 1a–1c illustrate the operation of a known chopper-stabilized current mirror.
Figure 1B:
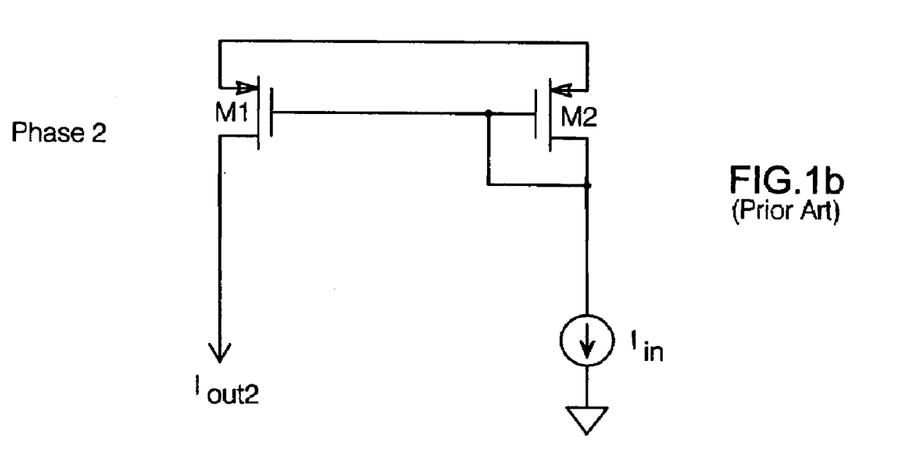
Figure 1C:
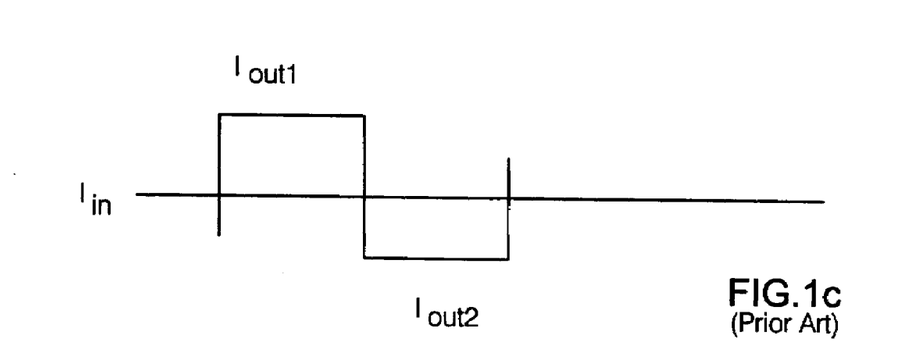

A simple two-transistor current mirror may not be able to provide a desired accuracy, due to the difficulty in precisely matching the two transistors. To mitigate errors that might otherwise arise due to transistor mismatch, a chopped current mirror is often employed; the operation of such a mirror is illustrated in FIGS. 1a–1c. The mirror operates with a two-phase chopping cycle. FIG. 1a shows the mirror's operation during the first phase: field-effect transistor (FET) M1 is diode-connected and mirrors an input current ($I_{in}$) to FET M2, which produces an output current $I_{out1}$. During the second chopping phase (FIG. 1b), M1 and M2 are interchanged: M2 is diode-connected and mirrors $I_{in}$ to M1, which produces an output current $I_{out2}$.

Though a chopped mirror reduces mismatch errors, they are not completely eliminated. Assume the current conducted by M2 mismatches that conducted by M1 by a ratio of (1+x), and that M1 and M2 are interchanged at a 50/50 duty cycle. The average output current $I_{out}$ will be given by (assuming a 50/50 duty cycle):

$$I_{out} = \frac{I_{out1} + I_{out2}}{2}$$

$I_{out1}$ is given by:

$$I_{out1} = I_{in}(1+x),$$

and $I_{out2}$ is given by:

$$I_{out2} = I_{in}\left(\frac{1}{1+x}\right).$$

Therefore, the mismatch (x) results in an error between $I_{in}$ and $I_{out}$ given by:

$$I_{out} = I_{in}\left(1 + \frac{x^2}{2+2x}\right).$$

If mismatch x is small:

$$I_{out} \cong I_{in}\left(1 + \frac{x^2}{2}\right).$$

The operation of the current mirror is visible in FIG. 1c, which depicts $I_{out1}$ and $I_{out2}$ with respect to $I_{in}$ during each phase of the chopping cycle. Other errors may arise due to, for example, parasitic capacitances present on the drains of the mirror transistors, device mismatches, and output impedance mismatches, which can produce an output offset error. Also, when the circuitry driving the chopped mirror is also chopped, timing-related errors may arise if the mirror and the driving circuit are chopped synchronously.

SUMMARY OF THE INVENTION

A chopper-stabilized current mirror is presented which overcomes some of the problems noted above, substantially reducing errors that might otherwise arise due to transistor mismatch, parasitic capacitances, and/or timing sensitivities.

The present mirror includes a primary pair of FETs having their sources connected to a supply voltage and their gates connected to an input current $I_{in}$. A first switching network (S1) has two inputs (in1, in2), two outputs (out1, out2), and a clock input. Inputs in1 and in2 are connected to the drains of the primary FETs, and S1 alternately connects in1 and in2 to out1 and out2, respectively, and to out2 and out1, respectively, in response to a first clock signal applied to the clock input. A second switching network (S2) also has its inputs in1 and in2 connected to sense the drains of the primary FETs, and alternately connects in1 and in2 to its outputs out1 and out2, respectively, and to out2 and out1, respectively, in response to a second clock signal.

The mirror also includes an output impedance ($r_o$) boost amplifier (A1) having differential inputs (in1, in2) connected to out1 and out2 of S2, respectively, differential outputs (out1, out2), and a reference voltage input to which a reference voltage $V_{ref}$ is applied.

A third switching network (S3) has its inputs in1, in2 connected to out1 and out2 of A1, respectively, and alternately connects its inputs in1 and in2 to its outputs out1 and out2, respectively, and to out2 and out1, respectively, in response to a third clock signal applied to S3's clock input.

A second pair of FETs have their sources connected to outputs out1 and out2 of S1, respectively, their gates connected to out1 and out2 of S3, respectively, with the drain of one of the FETs connected to $I_{in}$ and the drain of the other FET providing the current mirror's output $I_{out}$, such that the primary pair of FETs are cascoded with the second pair and such that $r_o$ boost amplifier A1 boosts the output impedance at the drain of the FET providing $I_{out}$.

The mirror is arranged such that switching network S1 is clocked by the first clock signal to reduce errors in $I_{out}$ due to mismatches between the primary FETs. Switching networks S2 and S3 are clocked by the second and third clock signals, respectively, to reduce errors in $I_{out}$ due to the offset voltage of the $r_o$ boost amplifier. Furthermore, the second and third clock signals are shifted with respect to the first clock signal to reduce errors in $I_{out}$ due to parasitic capacitances present at the sources of the second pair of FETs. The clock signals are also arranged to operate S1–S3 such that the $r_o$ boost amplifier always operates with negative feedback.

Further features and advantages of the invention will be apparent to those skilled in the art from the following detailed description, taken together with the accompanying drawings.

DETAILED DESCRIPTION OF THE INVENTION

Figure 2A:
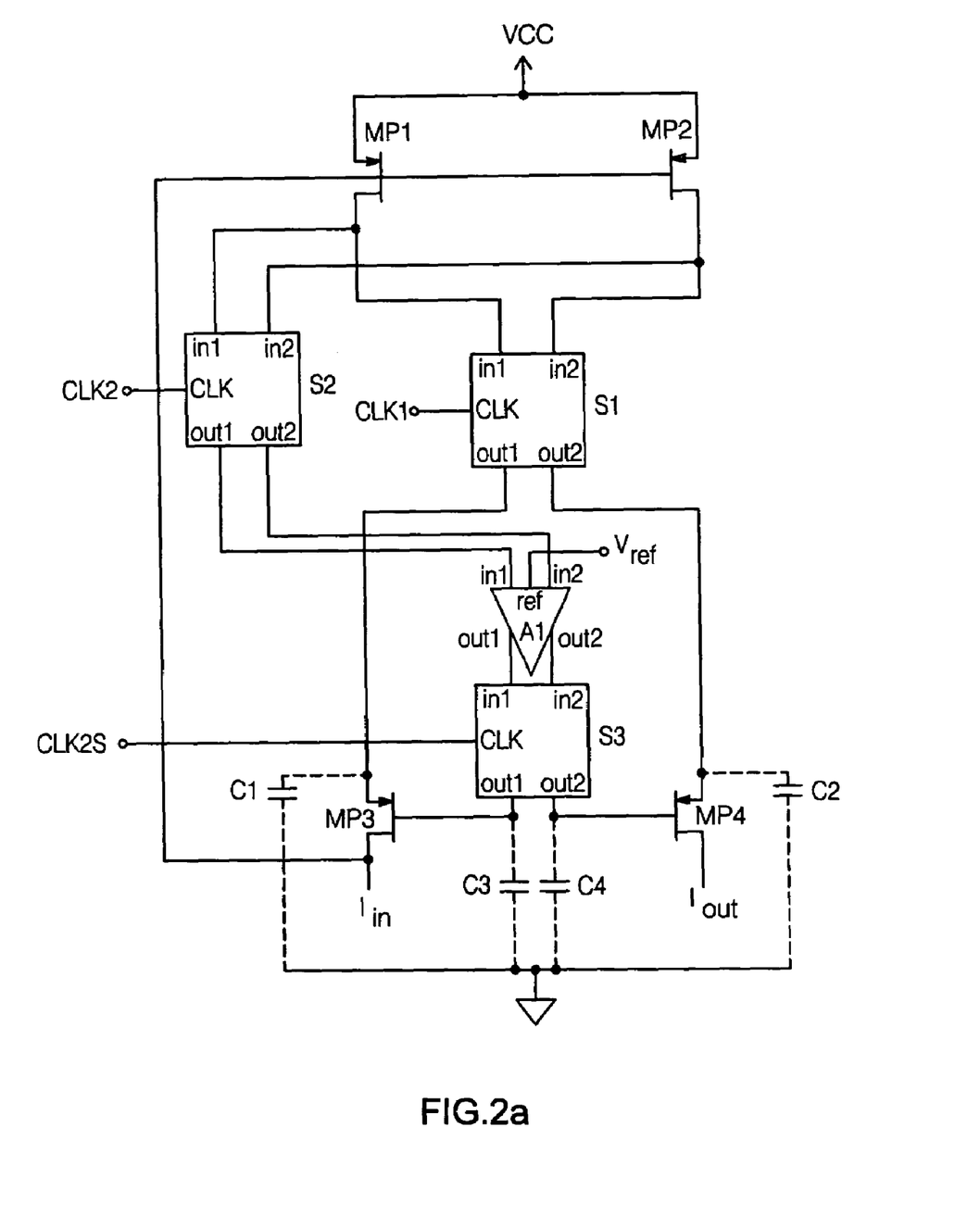
FIG. 2a is a schematic diagram of a chopper-stabilized current mirror per the present invention.

A chopper-stabilized current mirror per the present invention is shown in FIG. 2a. A "primary" pair of FETs MP1 and MP2 have their sources connected to a supply voltage (VCC) and their gates commonly connected to a current to be mirrored: input current $I_{in}$. The drains of MP1 and MP2 are connected to the inputs of a switching network S1. S1 has two inputs (in1, in2), two outputs (out1, out2), and a clock input. In operation, S1 connects in1 and in2 to out1 and out2, respectively, or connects in1 and in2 to out2 and out1, respectively, in response to a clock signal CLK1 applied to the clock input. For example, in the embodiments illustrated herein, the switching networks (including S1) are arranged such that in1 and in2 are connected to out1 and out2, respectively, when the applied clock signal is low, and in1 and in2 are connected to out2 and out1, respectively, when the applied clock signal is high. Such switching networks are well-known.

A second switching network S2, configured and operated identically to S1, also has its inputs in1 and in2 connected to the drains of MP1 and MP2, respectively. S2 operates in response to a clock signal CLK2 applied to its clock input.

An amplifier (A1) has differential inputs (in1, in2) and outputs (out1, out2), and a reference voltage input. Inputs in1 and in2 are connected to out1 and out2 of S2, respectively, and the reference voltage input is connected to a voltage $V_{ref}$. A1's outputs out1 and out2 are connected to the inputs in1 and in2 of a switching network S3, respectively, which is configured and operated in the same manner as S1 and S2. S3 operates in response to a clock signal CLK2S applied to its clock input. Note that switching networks S1–S3 could be implemented in many different ways well-known to those familiar with the field. For example, S1 and S2 might be made from PMOS FETs, with S3 made from PMOS and NMOS FETs.

A second pair of FETs MP3 and MP4 have their sources connected to S1's outputs out1 and out2, respectively, and their gates connected to S3's outputs out1 and out2, respectively; the drain of MP3 is connected to input current $I_{in}$, and the drain of MP4 provides the current mirror's output current $I_{out}$.

When so arranged, FETs MP1 and MP2 are cascoded with FETs MP3 and MP4 via S1. The outputs of amplifier A1 drive FETs MP3 and MP4 such that the voltages at the drains of MP1 and MP2 are made equal to $V_{ref}$. In this way, the output impedance at the drain of MP4 is increased; as such, amplifier A1 is referred to herein as an "$r_o$ boost" amplifier.

The chopping provided by each of the current mirror's switching networks operates to reduce or eliminate one or more components of error in output current $I_{out}$. Switching network S1 provides the basic chopping required to reduce errors in $I_{out}$ due to mismatches between MP1 and MP2. The current ($I_{in}$) being mirrored is often provided by a driving circuit that is itself chopped. In this case, switching network S1 is preferably chopped at a frequency different from that used to chop the driving circuit—preferably twice the driving circuit frequency—to avoid DC errors. The chopping clocks for the driving circuit and for S1 are also preferably skewed, to reduce or eliminate timing sensitivities that can occur if the driving circuit's chopping switches and the S1 switches transition at the same time.

Switching networks S2 and S3 operate together to reduce several different error components. One source of error reduced by the chopping provided by S2 and S3 is that which would otherwise arise due to the offset voltage of $r_o$ boost amplifier A1. By periodically reversing the inputs to A1, as well as A1's outputs to MP3 and MP4, error in $I_{out}$ due to the offset voltage of A1 is substantially reduced. To minimize errors due to A1's offset voltage, the clock operating S2 (CLK2) preferably operates at twice the frequency of the clock driving S1 (CLK1).

Another possible source of error is the parasitic n-well to substrate capacitances (C1, C2) of MP3 and MP4, and any equivalent capacitances. These capacitances can result in an error current proportional to A1's offset voltage and 1/fc. To ensure that these capacitances do not give rise to a parasitic current in $I_{out}$, the clocks driving switching networks S2 and S3 are shifted with respect to the clock driving switching network S1, such that the voltages that appear across C1 and C2 start and finish each portion of the mirror chopping cycle at the same voltage; this is illustrated in more detail below. When so arranged, no charge will have been transferred from these parasitic capacitances.

Figure 2B:
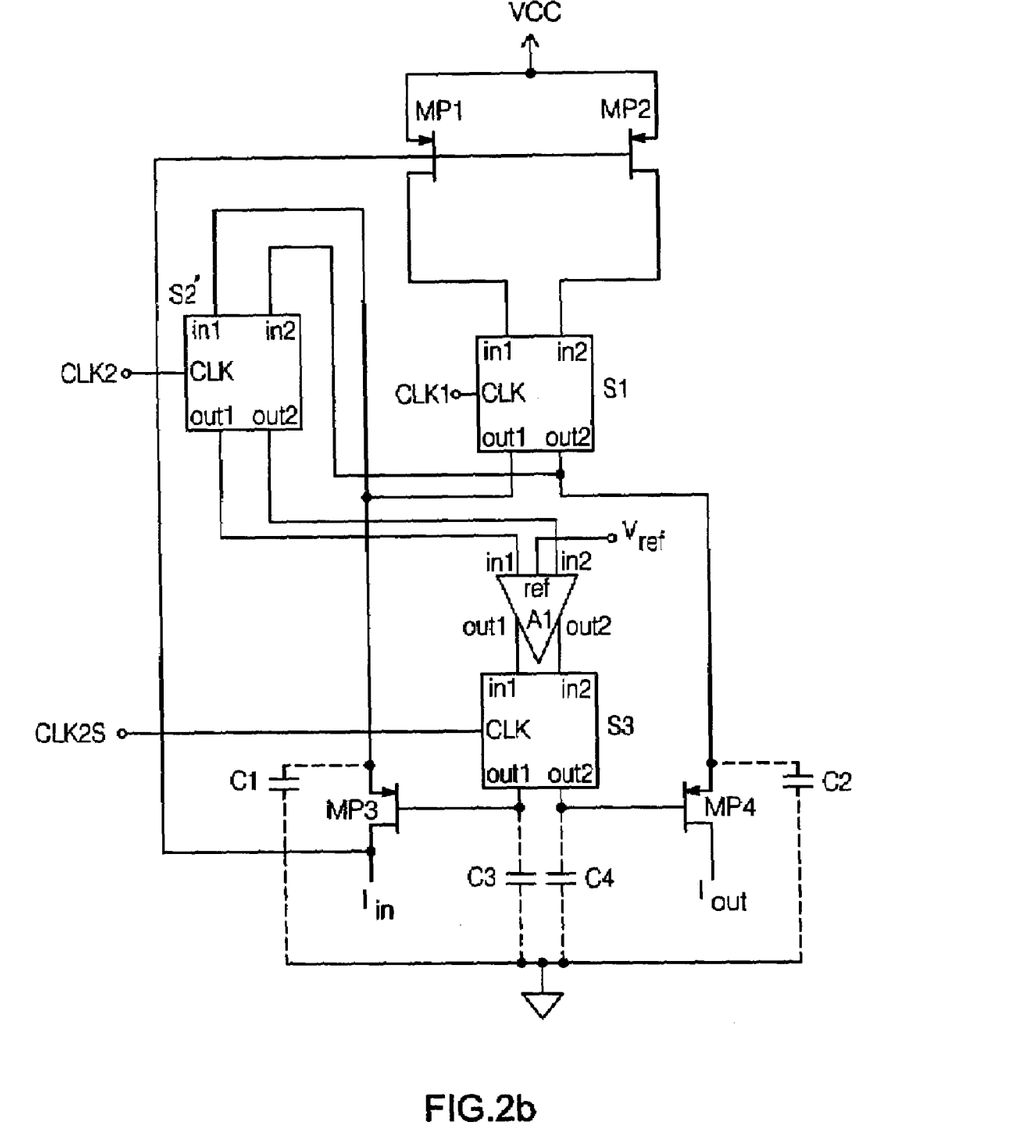
FIG. 2b is a schematic diagram of an alternative embodiment of a chopper-stabilized current mirror per the present invention.

One possible alternative implementation of the present chopper-stabilized current mirror is shown in FIG. 2b. This configuration is identical to that shown in FIG. 2a, except here, inputs in1 and in2 of switching network S2 (here labeled S2') are connected to outputs out1 and out2, respectively, of switching network S1. As with S2 in FIG. 2a, S2' acts to chop out the offset voltage of A1.

Note that, though the transistors depicted in the exemplary embodiments described herein are shown as FETs, the invention could also be realized with bipolar transistors, as well as with opposite polarity implementations.

Figure 3:
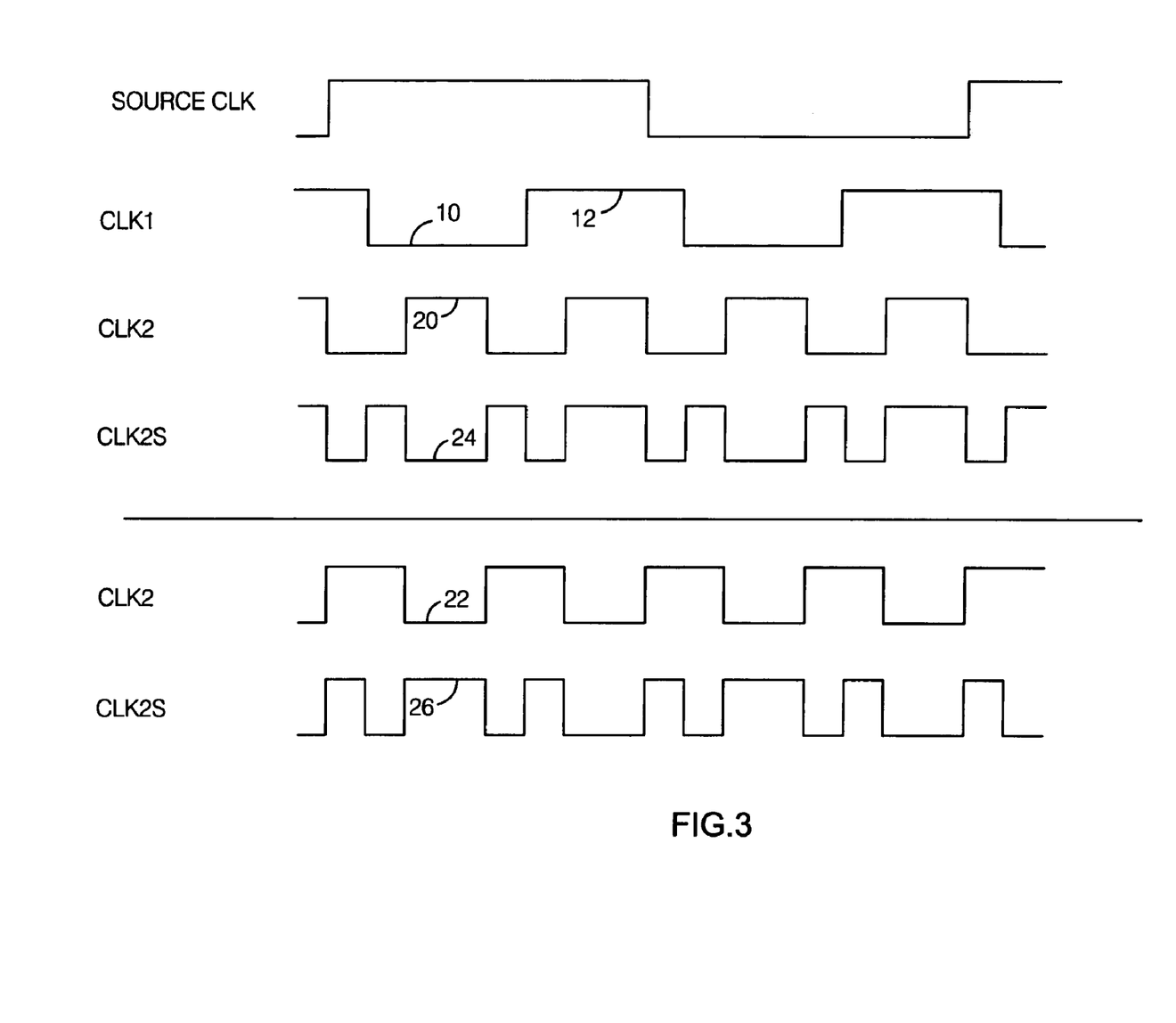
FIG. 3 is a timing diagram which illustrates the operation of the chopper-stabilized current mirror per the present invention.

An exemplary timing diagram illustrating the operation of the current mirror depicted in FIGS. 2a and 2b is shown in FIG. 3. For applications in which the circuit which provides $I_{in}$ is chopped, an exemplary chopping clock DRIVE CLK is shown. As noted above, the clock (CLK1) driving switching network S1 is preferably chopped at twice the frequency of DRIVE CLK, to avoid DC errors; furthermore, DRIVE CLK and CLK1 are preferably skewed, to reduce or eliminate timing sensitivities that can occur if the driving circuit's chopping switches and the S1 switches transition at the same time. In this example, in a first chopping phase (10) MP1 is diode-connected (via MP3) and accepts the input current and the output current comes from MP2; in the second chopping phase (12) MP2 is diode-connected (via MP3) and MP1 becomes the output device for the mirror.

As noted above, CLK2 preferably operates at twice the frequency of the CLK1 signal driving S1. In addition, CLK2 and CLK2S are shifted with respect to CLK1, such that the voltages that appear across C1 and C2 start and finish each portion of the mirror chopping cycle at the same voltage—to ensure that no charge is transferred from the parasitic capacitances of the mirror FETs', the cascode FETs, and/or the switching networks to output current $I_{out}$. The amount of phase shift required to accomplish this need not be exact, though a shift of an eighth-cycle is preferred. It is only necessary that:

when CLK1 goes low, CLK2 is low, and when CLK1 goes high, CLK2 has already returned low again (as illustrated with trace 20 in FIG. 3), or when CLK1 goes low, CLK2 is high, and when CLK1 goes high, CLK2 has already returned high again (as illustrated with alternative CLK2 trace 22 in FIG. 3, which is the inverse of trace 20).

To properly eliminate errors due to A1's offset voltage, CLK2 should have a duty cycle of 50% during each respective phase of CLK1. Thus, the ratio of high time to low time for CLK2 is preferably 50/50 while CLK1 is low, and when CLK1 is high.

Clock signal CLK2S is adjusted such that amplifier A1 is always operating with negative feedback, with S1–S3 operated to provide the necessary feedback paths from the outputs of A1, through MP3 and MP4 and the drains of MP1 and MP2 back to the inputs of A1. This enables A1 to operate in its linear region. In FIG. 3, clock signal CLK2S is shown as it might look when CLK2 is per trace 20 (see trace 24). When CLK2 is per trace 22, CLK2S must also be inverted to maintain negative feedback (see trace 26).

Amplifier A1 would typically be frequency compensated, using, for example, capacitors C3 and C4 connected between out1 and out2 of S3 and a fixed potential, typically ground.

When CLK1, CLK2 and CLK2S are arranged to eliminate errors due to A1's offset voltage and the parasitic capacitances of the mirror FETs', the cascode FETs, and/or the switching networks as described herein, the total error in the mirror's output current may be reduced by a factor of 5–10 (according to simulations). The advantages offered by the present mirror may be realized when the mirror is arranged to provide a 1:1 input/output transfer function, as well as with non-unity transfer functions.

Figure 4A:
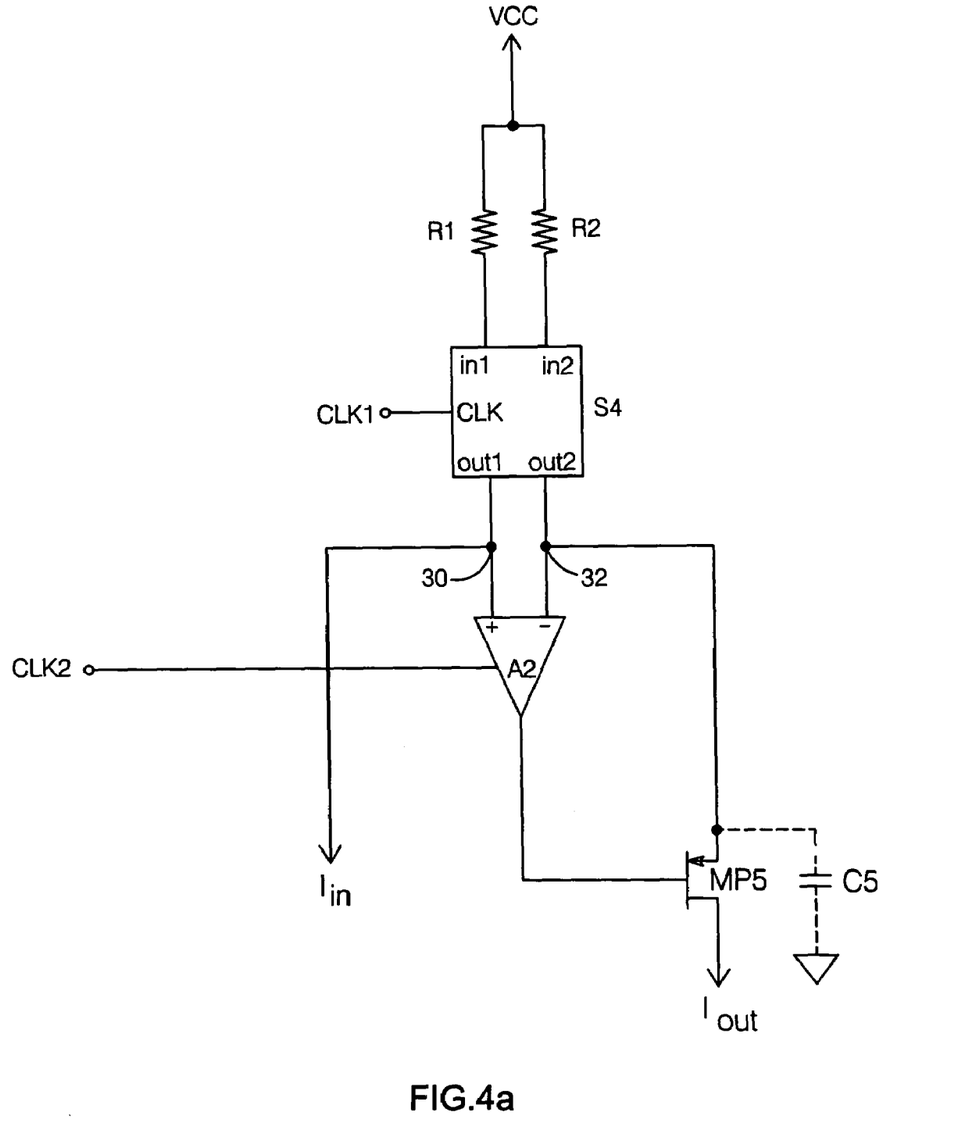
FIG. 4a is a schematic diagram of an alternative embodiment of a chopper-stabilized current mirror per the present invention.

Another embodiment which reduces parasitic capacitance-related errors in a current mirror's output current is shown in FIG. 4a. Here, FETs MP1 and MP2 are replaced with respective resistors having resistances R1 and R2, respectively. R1 and R2 are connected between a supply voltage and the inputs (in1, in2) of a switching network S4. The outputs (out1, out2) of S4 are connected to the non-inverting and inverting inputs of an amplifier A2 at nodes 30 and 32, respectively; A2 is a chopped amplifier. The output of A2 drives a FET MP5, the source of which is connected to node 32 and the drain of which provides the circuit's output current $I_{out}$. The input current $I_{in}$ is applied at node 30.

In operation, during one phase of the chopping cycle, $I_{in}$ causes a voltage $V=I_{in}*R1$ to appear across R1. This voltage is forced across R2 by A2 and MP5, resulting in an output current $I_{out}$ given by: $I_{out}=(I_{in}*R1)/R2$. By switching the positions of R1 and R2 with switching network S4, output current error due to mismatch between R1 and R2 is reduced.

However, parasitic capacitance (C5) is present at the source of MP5, which can produce a current that results in an error in $I_{out}$. To overcome this, the clocks used to operate S4 and A2 are skewed with respect to each other in the same manner as CLK1 and CLK2 are for the circuits of FIGS. 2a and 2b; i.e., CLK1 and CLK2 have the same relationship as that shown in FIG. 3. When so arranged, the voltage at the positive input of A2 is $I_{in}*R1$ in one phase, and $I_{in}*R2$ in the second phase. By chopping A2 at twice the frequency used to chop S4, the voltage across C5 can be made constant at the start and end of each phase of S4's chopping cycle. This results in no charge transfer from C5.

Figure 4B:
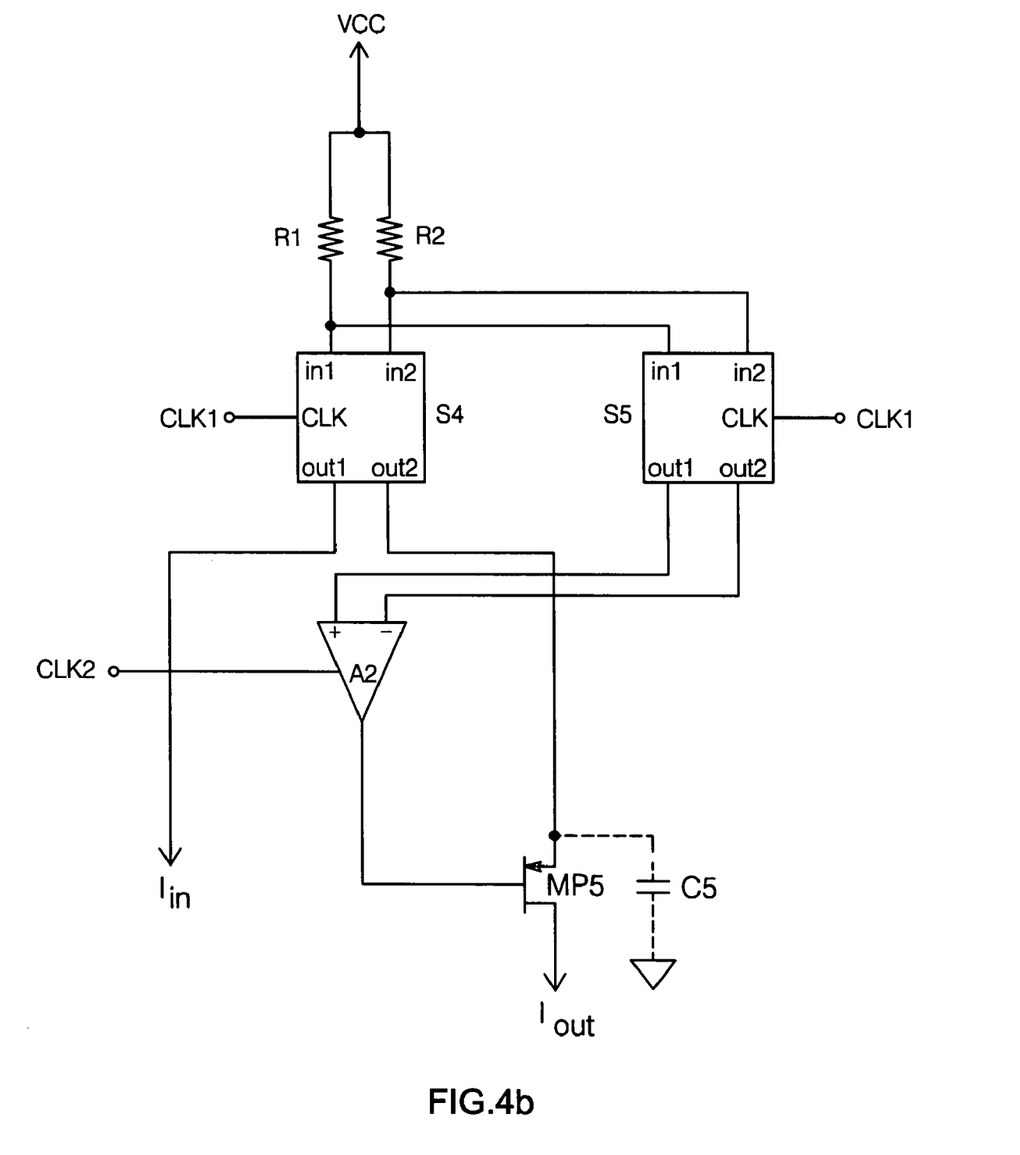
FIG. 4b is a schematic diagram of an alternative embodiment of a chopper-stabilized current mirror per the present invention.

In FIG. 4a, the voltage forced across R2 may contain an error due to the resistance of switching network S4. This source of error is eliminated with the circuit shown in FIG. 4b. This embodiment is similar to that shown in FIG. 4a, except that here, the inputs to amplifier A2 are connected to sense the R1 and R2 voltages directly at the resistors, via a switching network S5—thereby avoiding the aforementioned error.

Note that, though MP1, MP2, R1 and R2 are shown and described as connected to a supply voltage VCC, the supply voltage may be ground or another fixed voltage. Further note that, though the implementations shown and described herein employ PMOS FETs, an opposite polarity version which employs NMOS FETs is also contemplated.

While particular embodiments of the invention have been shown and described, numerous variations and alternate embodiments will occur to those skilled in the art. Accordingly, it is intended that the invention be limited only in terms of the appended claims.

We claim:

1. A chopper-stabilized current mirror, comprising:
   a first pair of field-effect transistors (FETs) (MP1, MP2) having their sources connected to a supply voltage and their gates connected to an input current $I_{in}$;
   a first switching network (S1) comprising two inputs (in1, in2), two outputs (out1, out2), and a clock input, said inputs in1 and in2 connected to the drains of MP1 and MP2, respectively, said network arranged to alternately connect in1 and in2 to out1 and out2, respectively, and to out2 and out1, respectively, in response to a first clock signal (CLK1) applied to S1's clock input;
   a second switching network (S2) comprising two inputs (in1, in2), two outputs (out1, out2), and a clock input, said inputs in1 and in2 coupled to the drains of MP1 and MP2, respectively, said second switching network arranged to alternately connect in1 and in2 to out1 and out2, respectively, and to out2 and out1, respectively, in response to a second clock signal (CLK2) applied to S2's clock input;
   an output impedance ($r_o$) boost amplifier (A1) having differential inputs (in1, in2) and outputs (out1, out2) and a reference voltage input, said differential inputs in1 and in2 connected to out1 and out2 of S2, respectively, and said reference voltage input connected to a voltage $V_{ref}$;
   a third switching network (S3) comprising two inputs (in1, in2), two outputs (out1, out2), and a clock input, said inputs in1 and in2 connected to out1 and out2 of A1, respectively, said third switching network arranged to alternately connect in1 and in2 to out1 and out2, respectively, and to out2 and out1, respectively, in response to a third clock signal (CLK2S) applied to S3's clock input; and
   a second pair of FETs (MP3, MP4) having their sources connected to outputs out1 and out2 of S1, respectively, their gates connected to out1 and out2 of S3, respectively, the drain of MP3 connected to $I_{in}$ and the drain of MP4 providing said current mirror's output $I_{out}$, such that said first pair of FETs are cascoded with said second pair of FETs and such that said amplifier boosts the output impedance at the drain of MP4;

said mirror arranged such that:

switching network S1 is clocked by CLK1 to chop the signals at the drains of MP1 and MP2 and thereby reduce errors in $I_{out}$ due to mismatches between MP1 and MP2; and switching network S2 is clocked by CLK2 to chop the offset voltage of amplifier A1 at the drains of MP1 and MP2 and switching network S3 is clocked by CLK2S to chop the signals at the outputs of A1 to reduce errors in $I_{out}$ due to the offset voltage of said $r_o$ boost amplifier and such that said $r_o$ boost amplifier always operates with negative feedback, CLK2 and CLK2S shifted with respect to CLK1 to reduce errors in $I_{out}$ due to parasitic capacitances at the sources of MP3 and MP4.

2. The current mirror of claim 1, wherein the frequency of CLK2 is twice that of CLK1.

3. The current mirror of claim 1, wherein CLK2 and CLK2S are shifted with respect to CLK1 such that the voltages that appear across said parasitic capacitances start and finish each portion of the mirror chopping cycle at the same voltage such that no charge is transferred from said parasitic capacitances to $I_{out}$.

4. The current mirror of claim 3, wherein CLK1 and CLK2 are arranged such that CLK2 is low during each transition of CLK1.

5. The current mirror of claim 3, wherein CLK1 and CLK2 are arranged such that CLK2 is high during each transition of CLK1.

6. The current mirror of claim 3, wherein CLK1 and CLK2 are arranged such that, while CLK1 is low, the ratio of the amount of time that CLK2 is low to the amount of time that CLK2 is high is 50:50.

7. The current mirror of claim 3, wherein CLK1 and CLK2 are arranged such that, while CLK1 is high, the ratio of the amount of time that CLK2 is low to the amount of time that CLK2 is high is 50:50.

8. The current mirror of claim 3, wherein CLK2 and CLK2S are phase-shifted by one-eighth cycle with respect to CLK1.

9. The current mirror of claim 1, wherein the circuitry which produces input current $I_{in}$ is chopped at a frequency a and CLK1 operates at a frequency b, such that a≠b.

10. The current mirror of claim 8, wherein b=2*a.

11. The current mirror of claim 1, further comprising first and second capacitors coupled to out1 and out2 of said differential amplifier to provide frequency compensation for said amplifier.

12. The current mirror of claim 1, wherein the frequency of CLK2 is twice that of CLK1, and CLK1 and CLK2 are arranged such that:

CLK2 is low during each transition of CLK1;

while CLK1 is low, the ratio of the amount of time that CLK2 is low to the amount of time that CLK2 is high is 50:50; and while CLK1 is high, the ratio of the amount of time that CLK2 is low to the amount of time that CLK2 is high is 50:50.

13. The current mirror of claim 1, wherein the frequency of CLK2 is twice that of CLK1, and CLK1 and CLK2 are arranged such that:

CLK2 is high during each transition of CLK1;

while CLK1 is low, the ratio of the amount of time that CLK2 is low to the amount of time that CLK2 is high is 50:50; and while CLK1 is high, the ratio of the amount of time that CLK2 is low to the amount of time that CLK2 is high is 50:50.

14. The current mirror of claim 1, wherein the inputs in1 and in2 of switching network S2 are connected to the drains of MP1 and MP2, respectively.

15. The current mirror of claim 1, wherein the inputs in1 and in2 of switching network S2 are connected to out1 and out2 of S1, respectively.

16. The current mirror of claim 1, wherein said FETs MP1 and MP2 and said switching networks have associated parasitic capacitances, said mirror arranged such that CLK2 and CLK2S are shifted with respect to CLK1 to reduce errors in $I_{out}$ due to said associated parasitic capacitances.

17. The current mirror of claim 1, wherein the circuitry which provides input current $I_{in}$ is chopped with a clock which is skewed with respect to CLK1.

18. A chopper-stabilized current mirror, comprising:

a first pair of field-effect transistors (FETs) (MP1, MP2) having their sources connected to a supply voltage and their gates connected to an input current $I_{in}$;

a first switching network (S1) comprising two inputs (in1, in2), two outputs (out1, out2), and a clock input, said inputs in1 and in2 connected to the drains of MP1 and MP2, respectively, said network arranged to alternately connect in1 and in2 to out1 and out2, respectively, and to out2 and out1, respectively, in response to a first clock signal (CLK1) applied to S1's clock input;

a second switching network (S2) comprising two inputs (in1, in2), two outputs (out1, out2), and a clock input, said inputs in1 and in2 connected to the drains of MP1 and MP2, respectively, said second switching network arranged to alternately connect in1 and in2 to out1 and out2, respectively, and to out2 and out1, respectively, in response to a second clock signal (CLK2) applied to S2's clock input;

an output impedance ($r_o$) boost amplifier (A1) having differential inputs (in1, in2) and outputs (out1, out2) and a reference voltage input, said differential inputs in1 and in2 connected to out1 and out2 of S2, respectively, and said reference voltage input connected to a voltage $V_{ref}$;

a third switching network (S3) comprising two inputs (in1, in2), two outputs (out1, out2), and a clock input, said inputs in1 and in2 connected to out1 and out2 of A1, respectively, said third switching network arranged to alternately connect in1 and in2 to out1 and out2, respectively, and to out2 and out1, respectively, in response to a third clock signal (CLK2S) applied to S3's clock input; and a second pair of FETs (MP3, MP4) having their sources connected to outputs out1 and out2 of S1, respectively, their gates connected to out1 and out2 of S3, respectively, the drain of MP3 connected to $I_{in}$ and the drain of MP4 providing said current mirror's output $I_{out}$, such that said first pair of FETs are cascoded with said second pair of FETs and such that said amplifier boosts the output impedance at the drain of MP4;

said mirror arranged such that:

the frequency of CLK2 is twice that of CLK1,

CLK2 is low during each transition of CLK1, while CLK1 is low, the ratio of the amount of time that CLK2 is low to the amount of time that CLK2 is high is 50:50, and while CLK1 is high, the ratio of the amount of time that CLK2 is low to the amount of time that CLK2 is high is 50:50;

switching network S1 is clocked by CLK1 to chop the signals at the drains of MP1 and MP2 and thereby reduce errors in $I_{out}$ due to mismatches between MP1 and MP2; and switching network S2 is clocked by CLK2 to chop the offset voltage of amplifier A1 at the drains of MP1 and MP2 and switching network S3 is clocked by CLK2S to chop the signals at the outputs of A1 to reduce errors in $I_{out}$ due to the offset voltage of said $r_o$ boost amplifier and such that said $r_o$ boost amplifier always operates with negative feedback, CLK2 and CLK2S shifted with respect to CLK1 such that the voltages that appear across parasitic capacitances at the sources of MP3 and MP4 start and finish each portion of the mirror chopping cycle at the same voltage such that no charge is transferred from said parasitic capacitances to $I_{out}$.

19. A chopper-stabilized current mirror, comprising:

a first pair of field-effect transistors (FETs) (MP1, MP2) having their sources connected to a supply voltage and their gates connected to an input current $I_{in}$;

a first switching network (S1) comprising two inputs (in1, in2), two outputs (out1, out2), and a clock input, said inputs in1 and in2 connected to the drains of MP1 and MP2, respectively, said network arranged to alternately connect in1 and in2 to out1 and out2, respectively, and to out2 and out1, respectively, in response to a first clock signal (CLK1) applied to S1's clock input;

a second switching network (S2) comprising two inputs (in1, in2), two outputs (out1, out2), and a clock input, said inputs in1 and in2 connected to the drains of MP1 and MP2, respectively, said second switching network arranged to alternately connect in1 and in2 to out1 and out2, respectively, and to out2 and out1, respectively, in response to a second clock signal (CLK2) applied to S2's clock input;

an output impedance ($r_o$) boost amplifier (A1) having differential inputs (in1, in2) and outputs (out1, out2) and a reference voltage input, said differential inputs in1 and in2 connected to out1 and out2 of S2, respectively, and said reference voltage input connected to a voltage $V_{ref}$;

a third switching network (S3) comprising two inputs (in1, in2), two outputs (out1, out2), and a clock input, said inputs in1 and in2 connected to out1 and out2 of A1, respectively, said third switching network arranged to alternately connect in1 and in2 to out1 and out2, respectively, and to out2 and out1, respectively, in response to a third clock signal (CLK2S) applied to S3's clock input; and a second pair of FETs (MP3, MP4) having their sources connected to outputs out1 and out2 of S1, respectively, their gates connected to out1 and out2 of S3, respectively, the drain of MP3 connected to $I_{in}$ and the drain of MP4 providing said current mirror's output $I_{out}$, such that said first pair of FETs are cascoded with said second pair of FETs and such that said amplifier boosts the output impedance at the drain of MP4;

said mirror arranged such that:
the frequency of CLK2 is twice that of CLK1,
CLK2 is high during each transition of CLK1, while CLK1 is low, the ratio of the amount of time that CLK2 is low to the amount of time that CLK2 is high is 50:50, and while CLK1 is high, the ratio of the amount of time that CLK2 is low to the amount of time that CLK2 is high is 50:50;

switching network S1 is clocked by CLK1 to chop the signals at the drains of MP1 and MP2 and thereby reduce errors in $I_{out}$ due to mismatches between MP1 and MP2; and switching network S2 is clocked by CLK2 to chop the offset voltage of amplifier A1 at the drains of MP1 and MP2 and switching network S3 is clocked by CLK2S to chop the signals at the outputs of A1 to reduce errors in $I_{out}$ due to the offset voltage of said $r_o$ boost amplifier and such that said $r_o$ boost amplifier always operates with negative feedback, CLK2 and CLK2S shifted with respect to CLK1 such that the voltages that appear across parasitic capacitances at the sources of MP3 and MP4 start and finish each portion of the mirror chopping cycle at the same voltage such that no charge is transferred from said parasitic capacitances to $I_{out}$.

20. A chopper-stabilized current mirror, comprising:

first and second resistors having resistances R1 and R2, respectively, connected between a supply voltage and first and second nodes, respectively;

a switching network (S4) comprising two inputs (in1, in2), two outputs (out1, out2), and a clock input, said inputs in1 and in2 connected to said first and second nodes, respectively, said network arranged to alternately connect in1 and in2 to out1 and out2, respectively, and to out2 and out1, respectively, in response to a first clock signal (CLK1) applied to S4's clock input;

a chopped amplifier (A2) having first and second inputs and an output, said first input connected to out1 at a third node to which a current ($I_{in}$) to be mirrored is applied and said second input connected to out2 at a fourth node, said amplifier chopped with a second clock signal (CLK2); and a transistor (MP5) having its gate connected to the output of A2, its source connected to said fourth node, and its drain providing said current mirror's output current $I_{out}$;

said mirror arranged such that:
switching network S4 is clocked by CLK1 to chop the signals at said first and second nodes and thereby reduce errors in $I_{out}$ due to mismatches between R1 and R2; and CLK2 is shifted with respect to CLK1 to reduce errors in $I_{out}$ due to parasitic capacitance at the source of MP5.

21. The current mirror of claim 20, wherein CLK2 is shifted with respect to CLK1 such that the voltage that appears across said parasitic capacitance starts and finishes each portion of the mirror chopping cycle at the same voltage such that no charge is transferred from said parasitic capacitance to $I_{out}$.

22. The current mirror of claim 21, wherein the frequency of CLK2 is twice that of CLK1.

23. A chopper-stabilized current mirror, comprising:

first and second resistors having resistances R1 and R2, respectively, connected between a supply voltage and first and second nodes, respectively;

a switching network (S4) comprising two inputs (in1, in2), two outputs (out1, out2), and a clock input, said inputs in1 and in2 connected to said first and second nodes, respectively, said network arranged to alternately connect in1 and in2 to out1 and out2, respectively, and to out2 and out1, respectively, in response to a first clock signal (CLK1) applied to S4's clock input, an input current ($I_{in}$) to be mirrored applied to out2 of S4;

a switching network (S5) comprising two inputs (in1, in2), two outputs (out1, out2), and a clock input, said inputs in1 and in2 connected to said first and second nodes, respectively, said network arranged to alternately connect in1 and in2 to out1 and out2, respectively, and to out2 and out1, respectively, in response to a first clock signal (CLK1) applied to S5's clock input;

a chopped amplifier (A2) having first and second inputs and an output, said first input connected to out1 of S5 and said second input connected to out2 of S5, said amplifier chopped with a second clock signal (CLK2); and a transistor (MP5) having its gate connected to the output of A2, its source connected to out2 of S4, and its drain providing said current mirror's output current $I_{out}$;

said mirror arranged such that:

switching networks S1 and S2 are clocked by CLK1 to chop the signals at said first and second nodes and thereby reduce errors in $I_{out}$ due to mismatches between R1 and R2; and CLK2 is shifted with respect to CLK1 to reduce errors in $I_{out}$ due to parasitic capacitance at the source of MP5.

24. The current mirror of claim 23, wherein CLK2 is shifted with respect to CLK1 such that the voltage that appears across said parasitic capacitance starts and finishes each portion of the mirror chopping cycle at the same voltage such that no charge is transferred from said parasitic capacitance to $I_{out}$.

25. The current mirror of claim 24, wherein the frequency of CLK2 is twice that of CLK1.

* * * * *